(12) United States Patent
Leon

(10) Patent No.: US 8,350,600 B2
(45) Date of Patent: Jan. 8, 2013

(54) GLITCHLESS CLOCK MULTIPLEXER CONTROLLED BY AN ASYNCHRONOUS SELECT SIGNAL

(75) Inventor: Christopher R. Leon, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1472 days.

(21) Appl. No.: 11/271,121

(22) Filed: Nov. 10, 2005

(65) Prior Publication Data
US 2008/0094108 A1    Apr. 24, 2008

Related U.S. Application Data

(60) Provisional application No. 60/627,595, filed on Nov. 12, 2004.

(51) Int. Cl.
*G06F 1/08* (2006.01)

(52) U.S. Cl. .......................................... 327/99; 327/298

(58) Field of Classification Search .................... 327/99, 327/291, 298
See application file for complete search history.

(56) References Cited

U.S. PATENT DOCUMENTS

| | | | |
|---|---|---|---|
| 4,965,524 A | 10/1990 | Patchen | 327/99 |
| 5,294,842 A | 3/1994 | Iknaian et al. | 327/144 |
| 5,504,684 A | 4/1996 | Lau et al. | 455/3.02 |
| 5,767,732 A | 6/1998 | Lee et al. | 327/525 |
| 6,009,319 A | 12/1999 | Khullar et al. | 340/7.38 |
| 6,411,135 B2 * | 6/2002 | Komoto | 327/99 |
| 6,483,888 B1 | 11/2002 | Boerstler et al. | 377/47 |
| 6,526,322 B1 | 2/2003 | Peng et al. | 700/5 |
| 6,784,699 B2 * | 8/2004 | Haroun et al. | 327/99 |
| 2001/0015653 A1 | 8/2001 | De Jong et al. | 327/525 |
| 2003/0184347 A1 | 10/2003 | Haroun et al. | 327/99 |

FOREIGN PATENT DOCUMENTS

| | | | |
|---|---|---|---|
| EP | 0 840 195 A2 | 5/1998 | |
| EP | 0 865 159 A1 | 9/1998 | |
| EP | 1 263 139 A2 | 12/2002 | |
| JP | 07248843 A | * | 9/1995 |
| JP | 2002082736 A | * | 3/2002 |
| JP | 2002351572 A | * | 12/2002 |

OTHER PUBLICATIONS

English translation of Igarashi et al. (JP 2002-351572).*

* cited by examiner

*Primary Examiner* — Quan Tra
(74) *Attorney, Agent, or Firm* — Bay Area Technology Law Group PC

(57) ABSTRACT

A glitchless clock multiplexer controlled by an asynchronous select signal for use in GPS receivers is disclosed. A device in accordance with the present invention comprises a device for producing a clock signal, the clock signal being selected from a plurality of asynchronous frequency sources. A device in accordance with the present invention comprises a first frequency source, a second frequency source, a select signal, wherein the select signal is asynchronous with the first frequency source, and a multiplexer, which receives the first frequency source and the second frequency source, wherein the multiplexer selects as an output of the multiplexer one of the first frequency source and the second frequency source based on a value of the select signal, such that when the multiplexer switches between the first frequency source and the second frequency source, and between the second frequency source and the first frequency source, the transition is performed when the output of the multiplexer is at a logic low.

2 Claims, 5 Drawing Sheets

GLITCHLESS CLOCK MULTIPLEXER CONTROLLED BY AN ASYNCHRONOUS SELECT SIGNAL

CROSS-REFERENCE TO RELATED APPLICATIONS

This application claims the benefit under 35 U.S.C. Section 119(e) of commonly-assigned U.S. provisional patent application Ser. No. 60/627,595, filed Nov. 12, 2004, entitled "RF CHIP FOR GLOBAL POSITIONING SYSTEM RECEIVER," by Lloyd Jian-Le Jiang et al., which application is incorporated by reference herein.

BACKGROUND OF THE INVENTION

1. Field of the Invention

The present invention relates generally to Global Positioning System (GPS) receivers, and in particular, to a glitchless clock multiplexer controlled by an asynchronous select signal used in GPS receivers.

2. Description of the Related Art

The use of GPS in consumer products has become commonplace. Hand-held devices used for mountaineering, automobile navigation systems, and GPS for use with cellular telephones are just a few examples of consumer products using GPS technology.

As GPS technology is being combined with these devices, the GPS chips are being placed in widely ranging applications. Some of these applications require that the GPS receiver function at low power levels, where GPS receiver manufacturers utilize techniques to shut off portions of the GPS receiver to conserve power consumption.

However, when the power is turned off to portions of the GPS receiver, it requires interesting partitions of the GPS receiver chips, such that those portions that must remain on to provide functionality are powered on for all power modes. One such example is the use of a Voltage Controlled Oscillator (VCO) to provide clock functions to the baseband processor of the GPS receiver. Typically, the VCO is part of the Radio Frequency (RF) portion of the GPS receiver, and must remain powered on during GPS low power modes of operation. This increases overall power draw because at least the VCO must remain powered on during low power modes, or a second VCO must be constructed for use by the baseband processor portion, making design and integration more difficult.

It can be seen, then, that there is a need in the art to reduce power consumption on GPS receivers. It can also be seen that there is a need in the art to be able to provide clocking functions to the baseband processor of a GPS receiver in low power modes of operation.

SUMMARY OF THE INVENTION

To minimize the limitations in the prior art, and to minimize other limitations that will become apparent upon reading and understanding the present specification, the present invention discloses a glitchless clock multiplexer controlled by an asynchronous select signal for use in GPS receivers.

A device in accordance with the present invention comprises a device for producing a clock signal, the clock signal being selected from a plurality of asynchronous frequency sources. A device in accordance with the present invention comprises a first frequency source, a second frequency source, a select signal, and a multiplexer, which receives the first frequency source and the second frequency source, wherein the multiplexer selects as an output of the multiplexer one of the first frequency source and the second frequency source based on a value of the select signal, such that when the multiplexer switches between the first frequency source and the second frequency source, and between the second frequency source and the first frequency source, the transition is performed when the output of the multiplexer is at a logic low.

Such a device further optionally includes the device being used to switch between the first frequency source and the second frequency source to change the frequency of the output of the multiplexer or to conserve power, the first frequency source being powered down after switching to the second frequency source, the first frequency source being a Voltage Controlled Oscillator (VCO), the second frequency source being a crystal oscillator, the select signal being a binary signal, the device being used in a Global Positioning System (GPS) receiver, and a state of the binary select signal being chosen to minimize power consumption of the GPS receiver when the GPS receiver is in a low power mode.

A GPS receiver in accordance with the present invention comprises a first frequency source, a second frequency source, a select signal, wherein the select signal is asynchronous with the first frequency source, and a multiplexer, which receives the first frequency source and the second frequency source, wherein the multiplexer selects as an output of the multiplexer one of the first frequency source and the second frequency source based on a value of the select signal, such that when the multiplexer switches between the first frequency source and the second frequency source, and between the second frequency source and the first frequency source, the transition is performed when an immediately prior output is at a logic low.

Such a GPS receiver optionally further includes the multiplexer being used to switch between the first frequency source and the second frequency source to change the frequency of the output of the multiplexer or to conserve power, the first frequency source being powered down after switching to the second frequency source, the first frequency source being a Voltage Controlled Oscillator (VCO), the second frequency source being a crystal oscillator, the select signal being a binary signal, the multiplexer being used to select a clock frequency for a baseband portion of the GPS receiver, and a state of the binary select signal being chosen to minimize power consumption of the GPS receiver when the GPS receiver is in a low power mode.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Figure 1:
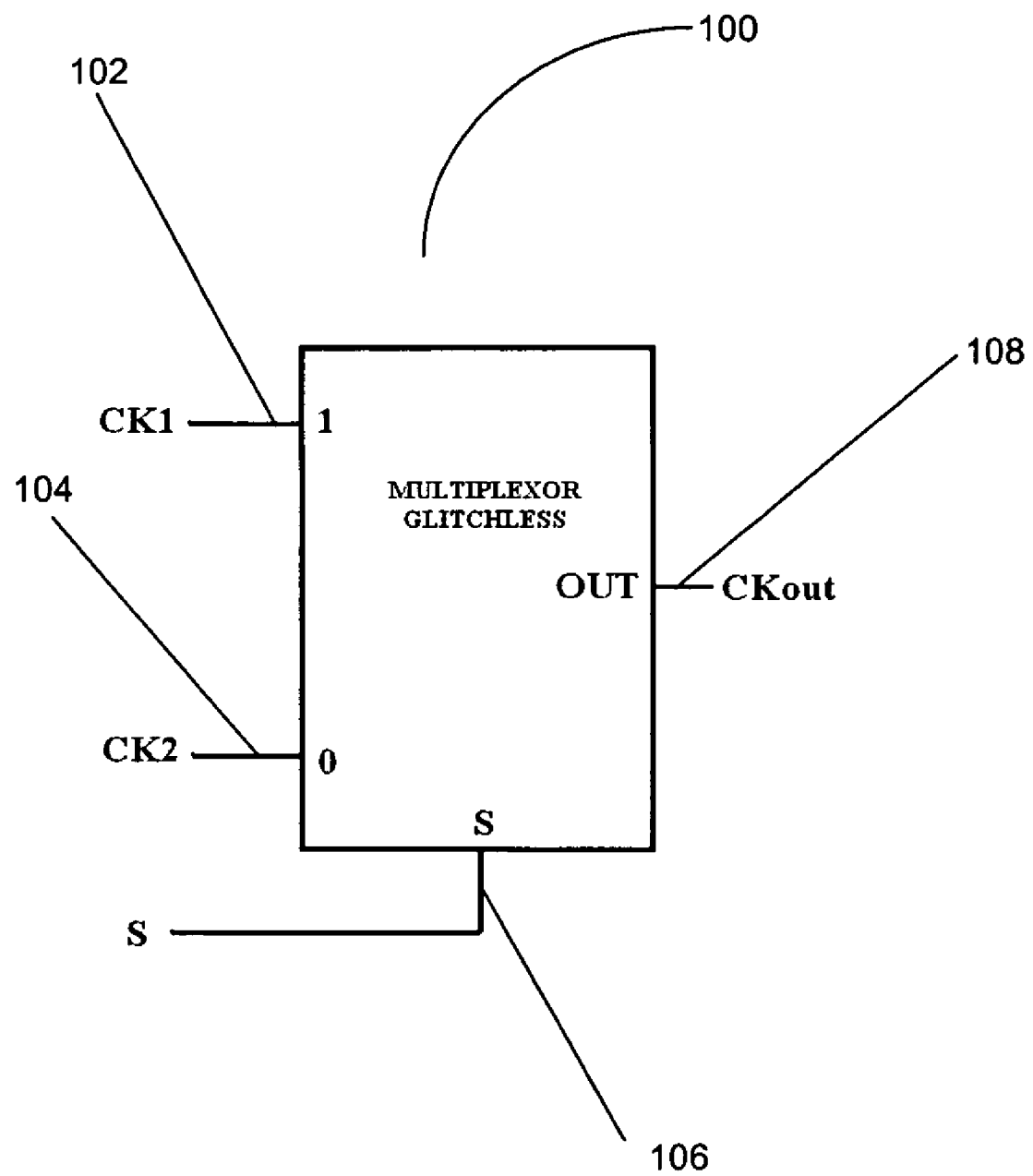
FIG. 1 illustrates a block diagram of the present invention.

FIG. 1 illustrates a block diagram of the present invention.

Multiplexer 100 is shown, with clock inputs 102 and 104. Select input 106 allows for selection of which clock input 102 or 104 is used to create output 108.

Clock input 102 receives an input from a first frequency source, CK1, while clock input 104 receives an input from a second frequency source, CK2. Select input 106 is typically a binary control line, where a first type of input (high, logic 1, or other "on" signal) selects clock input 102 as the source, while a second type of input placed into select input 106 selects clock input 104 as the source, to generate a frequency output at output 108.

So, for example, and not by way of limitation, frequency source CK1 connected to clock input 102 can be from a crystal, while frequency source CK2 connected to clock input 104 can be from a VCO. When select input 106 is high (or low, depending on the selection logic used in multiplexer 100), the output 108 will be that of frequency source CK1. When select input 106 is of the opposite level, the output 108 will be that of frequency source CK2.

Multiplexer 100 allows for the use of a secondary frequency source, such as a crystal, allowing a baseband processor in a GPS receiver to normally use CK2, which is coupled to a VCO, as a frequency source (clock), but, when certain power modes are used, allows for a secondary frequency source connected to CK1 such that the frequency source CK2 to be powered down. By selecting the control signal used at select input 106 to be low (typically 0 volts) when frequency source CK1 is used at output 108, even more power can be saved using multiplexer 100 of the present invention.

Select input 106, as contemplated in the present invention, is not required to be synchronous with either of the input frequency sources CK1 or CK2, and, as such, acts as a control of output 108 to select either CK1 or CK2 at any time without regard to rising edges, falling edges, or other characteristics of the frequency sources CK1 or CK2. Further, the multiplexer 100 of the present invention does not require that CK1 and CK2 are synchronous with each other, whereas related art systems needed such synchronous timing to be able to switch from one frequency source to another.

The multiplexer 100 of the present invention synchronizes the asynchronous signal at select input 106 with the frequency sources CK1 and/or CK2, and the output 108 is also synchronized to the selected frequency source used, to prevent the generation of output 108 pulses smaller than the smallest pulse width generated by CK1 or CK2. Such pulses that are smaller than the smallest pulse width of CK1 and CK2 are known as glitches, which can disrupt the processing or other synchronization required by circuitry using the output 108 frequency.

Multiplexer Design

Figure 2:
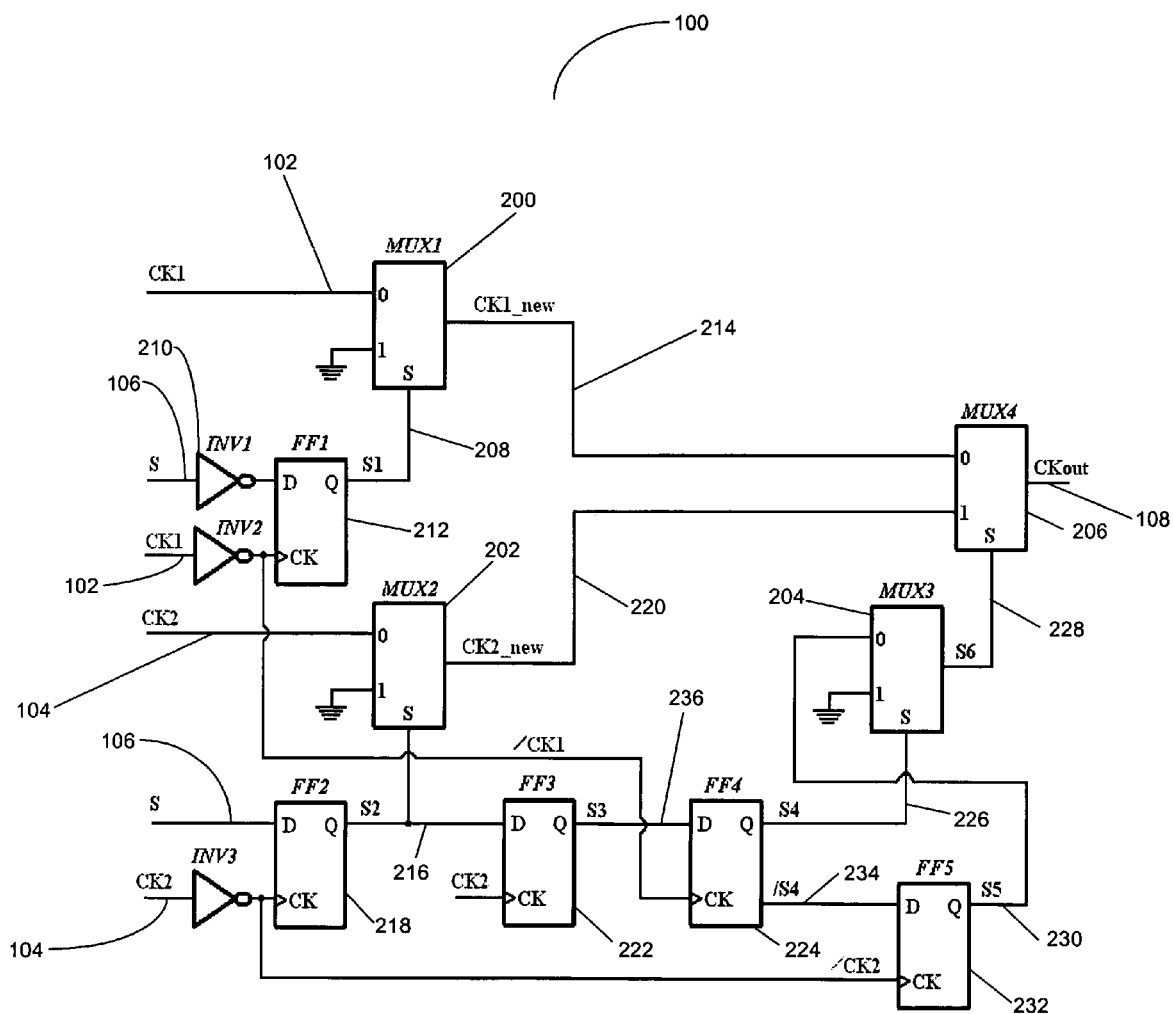
FIG. 2 illustrates a schematic diagram of an embodiment of the multiplexer of the present invention.

FIG. 2 illustrates a schematic diagram of an embodiment of the multiplexer of the present invention.

The multiplexer 100 of the present invention synchronizes the select signal S (select signal 106) to the clock signals (clock input 102 or clock input 104, also called CK1 or CK2) that select signal 106 selects, as well as synchronizing to the falling edge of the selected clock signal (CK2 or CK1), to generate output signal 108 (CKout).

Initial Conditions

Initially, select signal S 106 has been at a logic low "0" for a long period of time, e.g., such that several falling and rising edges of CK1 102 and CK2 104 have passed. When such an initial condition is present, the state of the select signals of each of the multiplexers MUX1 200, MUX2 202, MUX3 204, and MUX4 206 of the multiplexer 100 are as follows.

Multiplexer MUX1 200 will have a signal S1 208 that is a logic high ("1"), because of inverter INV1 210 inverting the select signal 106 prior to inputting to flip-flop FF1 212. Since the logic high input to MUX1 200 is grounded, output CK1_new 214 will be set at zero volts, which is a logic low ("0").

MUX2 202 will have a select signal S2 216 at a logic will be at a logic low "0" because FF2 218 receives select signal 106 directly without inversion. This forces the output CK2_new 220 to be equivalent to CK2 104. S2 216 is forwarded to FF3 222 and FF4 224, where select signal S4 226 sets the output of MUX3 204, which is signal S6 228, to be the same as that of signal S5 230. S5 230 is a logic high, because the input to FF5 232 is the opposite of signal S4 226, namely, signal /S4 234. /S4 234 is a logic high "1", which forces MUX4 206 to sets its output CKout 108 to be that of CK2, present as input signal 220 (CK2_new).

Change in Select Signal from Low to High

When the select signal S 106 changes from a logic low "0" to a logic high "1", the INV1 210 output changes from high "1" to low "0" and flip-flop FF1 212 output S1 208 is forced to a logic low "0" on the falling edge of CK1 102. As such, the output of MUX1 200, namely, signal CK1_new 214, changes from) volts (the ground connection to the logic high input to MUX1 200) to CK1 102, which is the input to the logic low input of MUX 200.

Since select signal S 106 is also coupled to FF2 218, S2 216 also changes to a logic high after the falling edge of CK2 104 which is used as an inverted clock input to FF2 218. S2 216 as a logic high then propagates to the output of the flip-flop FF3 222 after a rising edge of CK2 104, then propagates to signal S4 226 after the falling edge of CK1 102. This sets S4 226 high, forcing the output of MUX3 204, namely, signal S6 228, to a logic low, which in turn will sets MUX4 206 to output at CKout 108 whatever is at CK1_new 214, which in this case is CK1 102. Clock signal CK1 102 is selected when it is in the low "0" state, avoiding the generation of a glitch, regardless of when select signal 106 is applied.

Change in Select Signal from High to Low

When the select signal S 106 changes from a logic high "1" to a logic low "0" the output of MUX4 206, namely, signal CKout 108, will remain equal to CK1 102 until either the select signal S1 208 or select signal S2 216 changes logic state. If the select signal to MUX1 200, namely, signal S1 208 changes, output CK1_new 214 is forced to 0V at the falling edge of CK1 102, which forces CKout 108 low.

If select signal S2 216 changes before S1 208, CK2_new 220 will switch from a logic low to CK2 104, but CKout 108 will remain equal to CK1_new 214 until S6 228 changes from a logic low to a logic high. To force this sequence of events, multiplexer 100 of the present invention directs the logic low of select signal S 106 to S2 216 at the falling edge of CK2 104 via FF2 218, and then to S3 236 at the rising edge of CK2 104. This forces S4 226 to a logic low at the falling edge of CK1 102, where MUX3 204 selects as its output S5 230 which is a logic low until the falling edge of CK2 because of FF5 232. After the falling edge of CK2 causes S5 to be set to a logic high, which in turn sets S6 230 to a logic high, CKout 108 is forced to CK2_new 220 when CK2 104 is in a logic low state, again avoiding the generation of a glitch during state transition.

Figure 3:
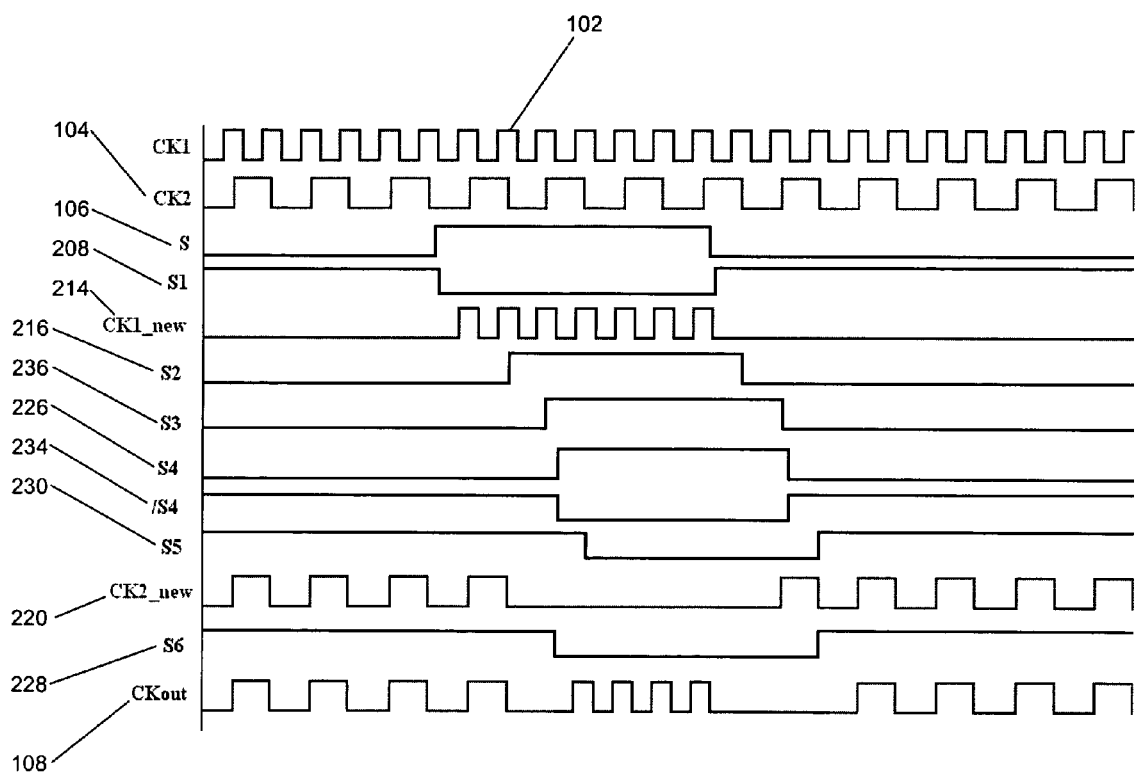
FIG. 3 illustrates a timing diagram of the circuit of FIG. 2 in accordance with the present invention.

FIG. 3 illustrates a timing diagram of the circuit of FIG. 2 in accordance with the present invention.

Alternative Embodiments

Figure 4:
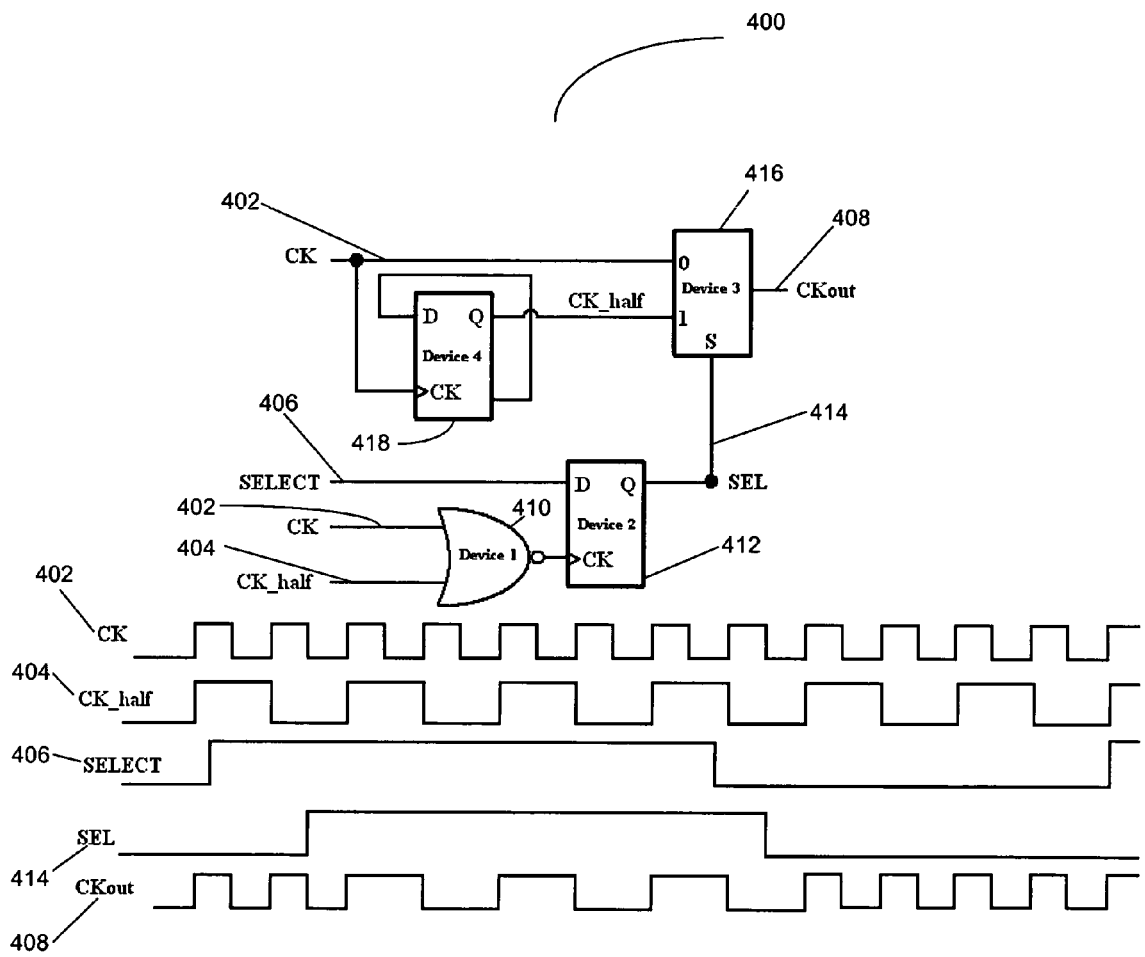
FIG. 4 illustrates an alternative embodiment of the circuit of the present invention.

FIG. 4 illustrates an alternative embodiment of the circuit of the present invention. Rather than using two different frequency sources, multiplexer 400 is used in systems that require a selection between two clock signals, signal CK 402 and signal CK_half 404, which are synchronized but with an even frequency difference, where the select signal 406 is not synchronized with any of the clocks to be selected. The output CKout 408 of the multiplexer 400 also avoids glitches unlike multiplexers of the related art.

The asynchronous select signal, SELECT 406, is first synchronized to a falling edge of one of the input clocks; CK 402 or CK_half 404. The clock that it is not transitioning from high to low (i.e., falling edge) must be at a logic low ("0") for the NOR gate (Device 1) 410 to generate a rising edge to trigger the FLIPFLOP (Device 2) 412 to load the SELECT signal 406. This generates the new synchronized SEL signal 414.

The synchronized signal SEL 414, which transitions after the falling edge of either clock 402 or 404, controls the multiplexer 416 (Device 3) which selects one of the clock signals 402 or 404 when both are low avoiding the generation of pulses shorter than the smallest pulse width of the fastest clock. The flip-flop (device 4) 418 divides the input clock frequency (CK 402) in half to generate signal CK_half 404.

Although as described herein, the present invention transitions on a logic low signal, the present invention also contemplates transitioning from one frequency source to another when the output of the present invention is at a logic high state. Similar delays and synchronization techniques can be designed without departing from the scope of the present invention to have transitions take place in either logic state of either frequency source. Further, the present invention can be expanded to select from more than two frequency sources, by cascading the present invention or by creating additional selection paths within the present invention, which will enable designers to select from a plurality of frequency sources by employing the present invention.

Applications for Multiplexer

Figure 5:
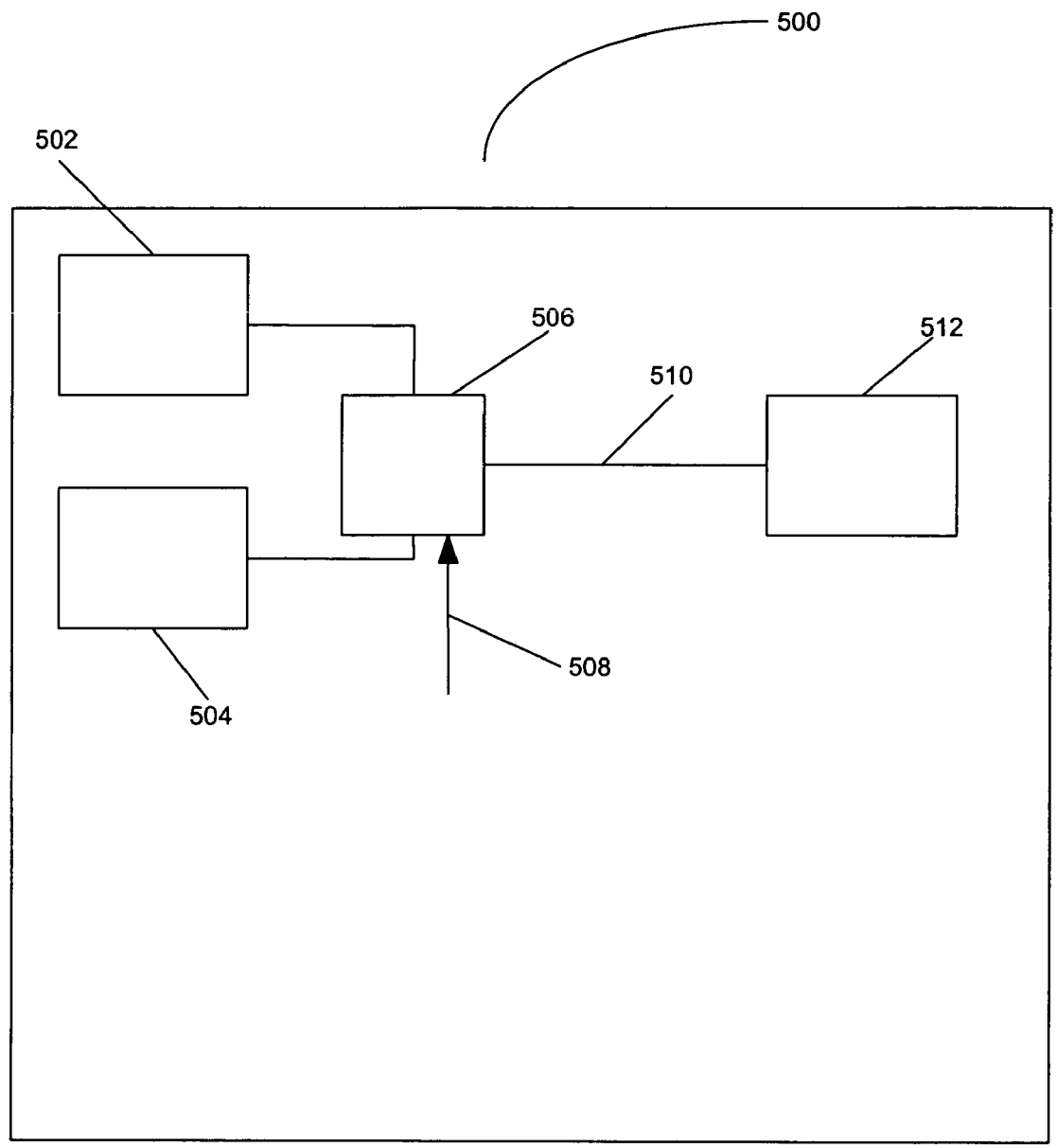
FIG. 5 illustrates an application for the multiplexer of the present invention.

FIG. 5 illustrates an application for the multiplexer of the present invention.

GPS receiver 500 is shown, with frequency source 502 and frequency source 504 connected to multiplexer 506 of the present invention. Select signal 508 is used to select between frequency sources 502 and 504 to produce output 510, which is used as an input to baseband section 512.

When one of the frequency sources 502 or 504 is or is about to become unavailable for use by baseband section 512, the select signal 508 can be used to switch to the other frequency source 502 or 504 such that baseband section 512 can continue processing data. For example, when the RF section of GPS receiver 500 is powered down, or in a reduced power mode, one of the frequency sources 502 and 504 might be a VCO, which could then be powered down as well, as long as the multiplexer 506 of the present invention switches to the other frequency source 502 or 504, such as a crystal oscillator or other frequency source for baseband section 512. Baseband section 512 can be a separate integrated circuit chip, or a portion of a single chip GPS receiver 500, depending on the design of GPS receiver 500, without departing from the scope of the present invention.

As shown, frequency sources 502 and 504 may also be two separate sources that remain powered, and rather than used to clock baseband section 512, output 510 can also be used as an input to a mixer in baseband section 512, or other places within GPS receiver 500, which would change the sum and difference frequencies that come out of a mixer. This would allow for a change in intermediate frequency (IF) to avoid changes in spurious interference that can be geographically or environmentally based, e.g., different transmission frequencies of cellular telephones in different parts of the world, such as Japan and the United States, where spurs would interfere with GPS processing.

CONCLUSION

In summary, a device in accordance with the present invention comprises a glitchless clock multiplexer controlled by an asynchronous select signal for use in GPS receivers. A device in accordance with the present invention comprises a first frequency source, a second frequency source, a select signal, wherein the select signal is asynchronous with the first frequency source, and a multiplexer, which receives the first frequency source and the second frequency source, wherein the multiplexer selects as an output of the multiplexer one of the first frequency source and the second frequency source based on a value of the select signal, such that when the multiplexer switches between the first frequency source and the second frequency source, and between the second frequency source and the first frequency source, the transition is performed when the output of the multiplexer is at a logic low.

Such a device further optionally includes the device being used to switch between the first frequency source and the second frequency source to change the frequency of the output of the multiplexer or to conserve power, the first frequency source being powered down after switching to the second frequency source, the first frequency source being a Voltage Controlled Oscillator (VCO), the second frequency source being a crystal oscillator, the select signal being a binary signal, the device being used in a Global Positioning System (GPS) receiver, and a state of the binary select signal being chosen to minimize power consumption of the GPS receiver when the GPS receiver is in a low power mode.

A GPS receiver in accordance with the present invention comprises a first frequency source, a second frequency source, a select signal, wherein the select signal is asynchronous with both the first frequency source, and a multiplexer, which receives the first frequency source and the second frequency source, wherein the multiplexer selects as an output of the multiplexer one of the first frequency source and the second frequency source based on a value of the select signal, such that when the multiplexer switches between the first frequency source and the second frequency source, and between the second frequency source and the first frequency source, the transition is performed when the output of the multiplexer is at a logic low.

Such a GPS receiver optionally further includes the multiplexer being used to switch between the first frequency source and the second frequency source to change the frequency of the output of the multiplexer or to conserve power, the first frequency source being powered down after switching to the second frequency source, the first frequency source being a Voltage Controlled Oscillator (VCO), the second frequency source being a crystal oscillator, the select signal being a binary signal, the multiplexer being used to select a clock frequency for a baseband portion of the GPS receiver, and a state of the binary select signal being chosen to minimize power consumption of the GPS receiver when the GPS receiver is in a low power mode.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims appended hereto and the equivalents thereof.

What is claimed is:

1. A device for producing a clock signal, the clock signal being selected from a plurality of asynchronous frequency sources, comprising:
   a first frequency source;
   a second frequency source;
   a select signal, wherein the select signal is asynchronous with both the first frequency source and the second frequency source; and
   a multiplexer, which receives the first frequency source and the second frequency source, wherein the multiplexer selects as an output of the multiplexer one of the first frequency source and the second frequency source based on a value of the select signal, such that when the multiplexer switches between the first frequency source and the second frequency source, and between the second frequency source and the first frequency source, the transition is performed when the output of the multiplexer is at a logic low, wherein the first frequency source is powered on prior to switching to the second frequency source and powered down after switching to the second frequency source wherein the first frequency source is a Voltage Controlled Oscillator (VCO); the second frequency source is a crystal oscillator; the select signal is a binary signal; and the device is used in a Global Positioning System (GPS) receiver.

2. The device of claim 1, wherein a state of the binary select signal is chosen to minimize power consumption of the GPS receiver when the GPS receiver is in a low power mode.

* * * * *